United States Patent [19]

Yamagata et al.

[11] Patent Number: 5,130,103
[45] Date of Patent: Jul. 14, 1992

[54] METHOD FOR FORMING SEMICONDUCTOR CRYSTAL AND SEMICONDUCTOR CRYSTAL ARTICLE OBTAINED BY SAID METHOD

[75] Inventors: Kenji Yamagata, Atsugi; Hideya Kumomi, Tokyo; Hiroyuki Tokunaga, Kawasaki; Kozo Arao, Hikone, all of Japan

[73] Assignee: Canon Kabushiki Kaisha, Tokyo, Japan

[21] Appl. No.: 752,922

[22] Filed: Aug. 30, 1991

Related U.S. Application Data

[63] Continuation of Ser. No. 662,326, Feb. 25, 1991, abandoned, which is a continuation of Ser. No. 234,754, Aug. 22, 1988, abandoned.

[30] Foreign Application Priority Data

Aug. 24, 1987 [JP] Japan .................................. 62-209456

[51] Int. Cl.$^5$ ................................................ B32G 9/00
[52] U.S. Cl. .................................. 428/209; 428/411.1; 428/457; 428/688; 428/700; 428/901; 250/578.1; 357/23.6; 357/70
[58] Field of Search .................. 428/209, 411.1, 457, 428/688, 700, 901; 250/578; 357/23.6, 70

[56] References Cited

U.S. PATENT DOCUMENTS

| | | | |
|---|---|---|---|
| 4,052,782 | 10/1977 | Weinstein et al. | 29/572 |
| 4,216,037 | 8/1980 | Katoda et al. | 148/175 |
| 4,657,603 | 4/1987 | Kruehler et al. | 148/175 |
| 4,800,527 | 1/1989 | Ozaki et al. | 357/23.6 |
| 4,866,291 | 9/1989 | Shimada et al. | 250/578 |

FOREIGN PATENT DOCUMENTS

| | | |
|---|---|---|
| 0241204 | 10/1987 | European Pat. Off. . |
| 0244081 | 11/1987 | European Pat. Off. . |
| 2117855 | 7/1972 | France . |
| 59-69495 | 8/1984 | Japan . |
| 2116067 | 9/1983 | United Kingdom . |
| 2189935 | 11/1987 | United Kingdom . |

OTHER PUBLICATIONS

Journal of Applied Physics, vol. 58, No. 7, Oct. 1985, pp. 2767-2769, American Institute of Physics, Woodbury, New York, S. Oku et al. "InP crystal growth planar SiO$_2$ substrates".

British Journal of Applied Physics, vol. 18, No. 10, Oct. 1967, pp. 1357-1382, GB, J. D. Filby et al. "Single-crystal films of silicon on insulators".

Primary Examiner—Patrick J. Ryan
Assistant Examiner—Kam F. Lee
Attorney, Agent, or Firm—Fitzpatrick, Cella, Harper & Scinto

[57] ABSTRACT

Semiconductor crystals are formed by applying a semiconductor crystal forming treatment on a substrate having a free surface on which a deposition surface ($S_{NDS}$) with a small nucleation density and a deposition surface ($S_{NDL}$) with metal having a sufficiently small area for crystal growth only from a single nucleus and having a greater nucleation density ($ND_L$) than the nucleation density ($ND_S$) of the deposition surface ($S_{NDS}$) are arranged adjacent to each other, thereby growing a semiconductor single crystal from the single nucleus.

33 Claims, 9 Drawing Sheets

METHOD FOR FORMING SEMICONDUCTOR CRYSTAL AND SEMICONDUCTOR CRYSTAL ARTICLE OBTAINED BY SAID METHOD

This application is a continuation of application Ser. No. 07/662,326 filed Feb. 25, 1991, now abandoned, which, in turn is a continuation of application Ser. No. 07/234,754, filed Aug. 22, 1988, now abandoned.

BACKGROUND OF THE INVENTION

1. Field of the Invention

This invention relates to a method for forming a semiconductor crystal and a semiconductor crystal article obtained by said method, particularly to a method for forming a semiconductor single crystal or a semiconductor polycrystal controlled in grain size prepared by utilizing the difference in nucleation density of the deposited materials according to the kinds of the deposited surface materials, and a crystal article obtained by said method.

The present invention is applicable for formation of a semiconductor crystal such as a semiconductor single crystal or a semiconductor polycrystal to be used for electronic devices, optical devices, magnetic devices, piezoelectric devices or surface acoustic devices, etc., such as semiconductor integrated circuits, optical integrated circuits, magnetic circuits, etc.

2. Related Background Art

In the prior art, single crystal thin films to be used for semiconductor electronic devices or optical devices have been formed by epitaxial growth on a single crystal substrate. For example, it has been known that epitaxial growth of Si, Ge, GaAs, etc., can be done from liquid phase, gas phase or solid phase on Si single crystal substrate (silicon wafer), and it has been also known that epitaxial growth of a single crystal such as GaAS, GaAlAs, etc., occurs on a GaAs single crystal substrate. By use of the semiconductor thin film thus formed, semiconductor devices and integrated circuits, electroluminescent devices such as semiconductor lasers or LED have been prepared.

Also, researches and developments have been recently made abundantly about ultra-high speed transistors by use of two-dimensional electronic gas, ultra-lattice devices utilizing quantum well, etc., and what has made these possible is the high precision epitaxial technique such as MBE (molecular beam epitaxy) or MOCVD (organometallic chemical vapor deposition) by use of ultra-high vacuum.

In such epitaxial growth on a single crystal substrate, it is necessary to take matching in lattice constants and coefficient of thermal expansion between the single crystal material of the substrate and the epitaxial growth layer. For example, although it is possible to effect epitaxial growth of Si single crystal thin film on sapphire which is an insulating single crystal substrate, the crystal lattice defect at the interface due to deviation in lattice constant and diffusion of aluminum which is a component of sapphire to the epitaxial layer pose problems in application for electronic devices or circuits.

Thus, the method for forming a single crystal thin film of the prior art by epitaxial growth may be understood to be dependent greatly on its substrate material. Mathews et al have examined about combinations of the substrate material with epitaxial growth layer (EPITAXIAL GROWTH, Academic Press, New York, 1975, ed. by J. W. Mathews).

Also, the size of the substrate is presently about 6 inches for Si wafer, and enlargement of GaAs, sapphire substrate is further retarded. In addition, since the single crystal substrate is high in production cost, the cost per chip becomes higher.

Thus, for production of a single crystal layer capable of preparing a device of good quality according to the method of prior art, there has been involved the problem that the kinds of the substrate materials are limited to an extremely narrow scope.

On the other hand, researches and developments of three-dimensional integrated circuits to accomplish high integration and multi-function by laminating semiconductor devices in the normal line direction of the substrate have been abundantly made in recent years, and also reserches and developments of large area semiconductor devices such as solar batteries of switching transistors of liquid crystal picture elements, etc., in which devices are arranged in an array on a cheap glass are becoming more abundant from year to year.

What is common to both of these is that the technique for forming a semiconductor thin film on an amorphous insulating material and forming an electronic device such as transistor, etc., thereon is required. Among them, particularly the technique for forming a single crystal semiconductor of high quality on an amorphous insulating material has been desired.

Generally speaking, when a thin film is deposited on an amorphous insulating material substrate such as $SiO_2$, etc., due to the defect of long distance order of the substrate material, the crystal structure of the deposited film becomes amorphous or polycrystalline. Here, the amorphous film refers to a state in which near distance order to the extent of the closest atoms is preserved, but no longer distance order exists, while the polycrystalline film refers to single cystal grains having no specific crystal direction gathered as separated at the grain boundaries.

For example, in the case of forming Si on $SiO_2$ according to the CVD method, if the deposition temperature is about 600° C. or lower, it becomes an amorphous silicon, while it becomes a polycrystalline silicon with grain sizes distributed between some hundred to some thousand Å at a temperature higher than said temperature. However, the grain sizes and their distribution of polycrystalline silicon will be varied greatly depending on the formation method.

Further, by melting and solidifying an amorphous or polycrystalline film by an energy beam such as laser or rod-shaped heater, etc., a polycrystalline thin film with great grain sizes of some microns or millimeters have been obtained (Single Crystal silicon on non-single-crystal insulator, Journal of crystal Growth vol. 63, No. 3, Oct., 1983 edited by G.W. Gullen).

When a transistor is formed on the thus formed thin film of respective crystal structures and electron mobility is measured from its characteristics, mobility of about 0.1 $cm^2$/V·sec or less is obtained for amorphous silicon, mobility of 1 to 10 $cm^2$/V·sec for polycrystalline silicon having grain sizes of some hundred Å, and a mobility to the same extent as in the case of single crystalline silicon for polycrystalline silicon with great grain sizes by melting and solidification.

From these results, it can be understood that there is great difference in electrical properties between the device formed in the single crystal region within the crystal grains and the device formed as bridging across the grain boundary. In other words, the deposited film on the amorphous material obtained in the prior art becomes amorphous or polycrystalline structure having grain size distribution, and the device prepared thereon is greatly inferior in its performance as compared with the device prepared on the single crystal layer. For this reason, the uses are limited to simple switching devices, solar batteries, photoelectric converting devices, etc.

On the other hand, the method for forming a polycrystalline thin film with great grain sizes by melting and solidification had the problems that an enormous time is required due to scanning of amorphous or single crystal thin film with energy beam for every wafer to be poor in bulk productivity, and also that it is not suited for enlargement of area.

Further, in recent years, studies of diamond thin film growth are becoming popular. Diamond thin film, which is particularly broad in bandgap as 5.5 eV as the semiconductor, can be actuated at higher temperature (about 500° C. or less) as compared with Si, Ge, GaAs, etc., which are semiconductor materials of the prior art. Also, the carrier mobility of both electrons and positive holes surpass that of Si (1800 $cm^2/V\cdot sec$ for electrons, 1600 $cm^2/V\cdot sec$ for positive holes), and thermal conductivity is also extremely high. For this reason, it has been expected to be promising for application in semiconductor devices of the great consumption power type with great heat generation quantity.

However, although there have been reports in the prior art about epitaxial growth of diamond thin film on a diamond subtrate by vapor phase growth (N. Fujimoto, T. Imai and A. Doi Pro. of Int. Couf. IPAT), there is no successful report about heteroepitaxial growth on a substrate other than diamond substrate.

Generally speaking, diamond nuclei are generated by utilizing excitation with microwave, using a hydrocarbon type gas such as $CH_4$, etc., and by irradiation with hot filament or electron beam, but the nucleation density is generally low, whereby a continuous thin film can be obtained with difficulty. Even if a continuous thin film may be formed, it has a polycrystalline structure with great grain size distribution and can be difficulty applied for semiconductor device.

Also, as long as a diamond substrate is used, it is expensive as a matter of course, posing also a problem in enlargement of area. Thus, it is not suitable for practical application.

As described above, in the crystal growth method of the prior art and the crystal formed thereby, three-dimensional integration or enlargement of area could not be done with ease to be difficulty applied practically for devices, and crystals such as single crystals and polycrystals, etc., required for preparation of devices having excellent characteristics could not be formed easily and at low cost.

SUMMARY OF THE INVENTION

A main object of the present invention is to provide a method for forming a semiconductor crystal which has overcome the problems of the prior art as described above and a crystal article obtained by said method.

Another object of the present invention is to provide a method for forming a semiconductor crystal of good quality such as single crystal containing no grain boundary or a polycrystal controlled in grain boundary, etc., without restriction with respect to the base materials, for example, without restriction with respect to materials, constitutions, sizes, etc., of the substrate, and a crystal article having the crystal obtained by said method.

Still another object of the present invention is to provide a method for forming the above semiconductor crystal with good efficiency according to simple steps without use of a special device.

Still another object of the present invention is to provide a semiconductor crystal article having a semiconductor single crystal which is grown singly on a nucleation surface ($S_{NDL}$), which nucleation surface ($S_{NDL}$) is formed on a crystal forming surface with a metal having sufficiently greater nucleation density (ND) than the material forming said crystal forming surface and has a sufficiently small area to the extent that only a single nucleus can be grown.

Still another object of the present invention is to provide a method for forming a semiconductor crystal by utilizing the difference in nucleation density of the crystal forming materials according to the kinds of the materials forming the crystal forming surface, which comprises forming on said crystal forming surface a nucleation surface ($S_{NDL}$) with a metal having sufficiently greater nucleation density than the material forming said crystal forming surface having a sufficiently small area so that only a single nucleus may grow thereon, forming only a single nucleus on said nucleation surface ($S_{NDL}$), and growing a single crystal from said single nucleus, thereby forming a semiconductor crystal.

Still another object of the present invention is to provide a method for forming a semiconductor crystal which comprises applying a crystal forming treatment on a substrate having a free surface on which a nonnucleation surface ($S_{NDS}$) with a small nucleation density and a nucleation surface ($S_{NDL}$) with a metal having a sufficiently small area for crystal growth only from a single nucleus and having a greater nucleation density ($ND_L$) than the nucleation density ($ND_S$) of said nonnucleation surface ($S_{NDS}$) are arranged adjacent to each other, thereby growing a semiconductor single crystal from said single nucleus.

Still another object of the present invention is to provide a method for forming a semiconductor crystal, which comprises forming, on a substrate having a small nonnucleation surface ($S_{NDS}$) with small nucleation density at a small area for a crystal growth from only a single nucleus at a desired position of said nonucleation surface ($S_{NDS}$), a nucleation surface ($S_{NDL}$) having greater nucleation density ($ND_L$) than the nucleation density ($ND_S$) of said nonnucleation surface ($S_{NDS}$) by addition of a metal ($M_L$) for forming said nucleation surface ($S_{NDL}$) which is different from the material ($M_S$) forming said nonnucleation surface ($S_{NDS}$), and then applying a crystal forming treatment on said substrate to form a single crystal nucleus on said nucleation surface ($S_{NDL}$), thereby growing a semiconductor signal crystal from said single nucleus.

Still another object of the present invention is to provide a method for forming a semiconductor crystal, which comprises applying a crystal forming treatment on a substrate having two kinds of surface with a sufficiently great nucleation density difference (ΔND), of which the surface ($S_{NDL}$) with smaller nucleation density had a sufficiently small area for growth of a semiconductor single crystal from only a single nucleus to form a stable single nucleus on said surface ($S_{NDL}$), thereby growing a semiconductor single crystal from said single nucleus.

Still another object of the present invention is to provide a semiconductor crystal article, comprising a substrate having a nonnucleation surface ($S_{NDS}$) with small nucleation density and a nucleation surface ($S_{NDL}$) with a metal, arranged adjacent to said nonnucleation surfaces ($S_{NDS}$), having a sufficiently small area for crystal growth from only a single nucleus and having greater nucleation density ($ND_L$) than the nucleation density ($ND_S$) of said nonnucleation surface ($S_{NDS}$), and a single crystal which grows from said single nucleus and covers sufficiently over said nucleation surface ($S_{NDL}$).

DETAILED DESCRIPTION OF PREFERRED EMBODIMENTS

For better understanding of the present invention, first the general process for forming a thin film of metal or semiconductor is explained.

When the deposition surface is made of a amterial different in kind from the flying atom, particularly an amorphous material, the flying atoms are diffused freely on the substrate surface, or again evaporated (released). And, as the result of collision mutually between the atoms, a nucleus is formed and when its size becomes the size rc ($= -2\sigma o/gv$) at which its free energy G becomes the maximum (critical nucleus), G is reduced and the nucleus continues to grow stably three-dimensionally to become shaped in an island. The nucleus with the size exceeding rc is called stable nucleus, and unless otherwise particularly noted, "nucleus" in the following basic description of the present invention refers to this "stable nucleus". Also, among "stable nucleus", those with small r are called "initial nucleus".

The free energy generated by formation of nucleus is represented as follows:

$$G = 4\pi f(\theta)(\sigma o\ r^2 + \tfrac{1}{3} \cdot gv \cdot r^3)$$

$$f(\theta) = \tfrac{1}{4}(2 - 3\cos\theta + \cos^2\theta)$$

wherein, r: radius curvature of nucleus
$\theta$: contact angle of nucleus
gv: free energy per unit deposition
$\sigma o$: surface energy between nucleus and vacuum.

Figure 1:
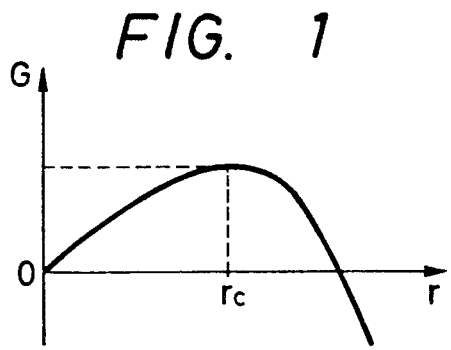
FIG. 1 is a graph for illustration of the relationship between the size of nucleus rc and free energy G in the process of forming thin film.

FIG. 1 shows the manner in which G is changed. In the same Figure, the radius of curvature of the stable nucleus when G is at the maximum value is rc.

Thus, nuclei grow to become shaped in islands, and further grow whereby contact mutually between islands progresses until sometimes coalescence occurs and via a network structure, it becomes finally a continuous film to cover completely over the substrate surface. Following such a process, a thin film is deposited on the substrate.

In the deposition process as described above, the density of nucelus formed per unit area of the substrate surface, the size of nucleus and the nucleation speed are determined depending on the state of the system of deposition, and particularly the interaction between the flying atoms and the substrate surface material is an important factor. Also, a specific crystal-direction grows in parallel to the substrate due to anisotropy relative to the crystal surface of the interface energy at the interface between the deposited material and the substrate, and when the substrate is amorphous, the crystal direction within the substrate plane is not constant. For this reason, grain boundaries are formed by collision mutually between nuclei or islands, and particularly in the case of collision mutually between islands with some sizes or greater, grain boundaries are formed as such rather than occurrence of coalescence. Since the grain boundaries formed are difficulty movable in the solid phase, the grain sizes are determined at the point.

Next, the selective deposition method for forming a deposited film selectively on the deposition surface is to be described. The selective deposition method is a method in which a thin film is formed selectively on the substrate by utilizing the differences between the materials in factors influencing nucleus formation in the thin film forming process such as surface energy, attachment coefficient, release coefficient, surface diffusion speed, etc.

Figure 2A:
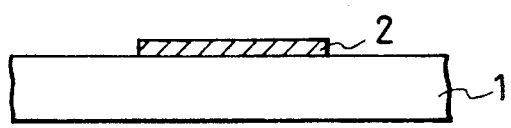
FIGS. 2A and 2B are illustrations of the selective deposition method.
Figure 2B:
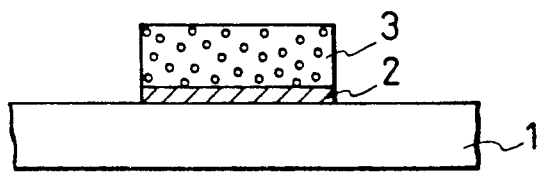

FIGS. 2A and 2B are illustrations of the selective deposition method. First, as shown in FIG. 2A on the substrate 1, a thin film 2 comprising a material different in the above factors from the substrate 1 is formed at a desired portion. And, when deposition of a thin film comprising an appropriate material is effected under appropriate deposition conditions, a thin film 3 grows only on the thin film 2, whereby it is possible to give rise to a phenomenon that no growth occurs on the substrate 1. By utilizing this phenomenon, the thin film 3 formed self-matchingly can be grown, whereby it becomes possible to omit the lithographic step by use of a resist as practiced in the prior art.

As the material for enabling deposition according to such selective formation method, for example, $SiO_2$ may be used as the substrate 1, Si, GaAS, silicon nitride as the thin film 2 and Si, W, GaAs, InP, etc., as the thin film 3 to be deposited.

Figure 3:
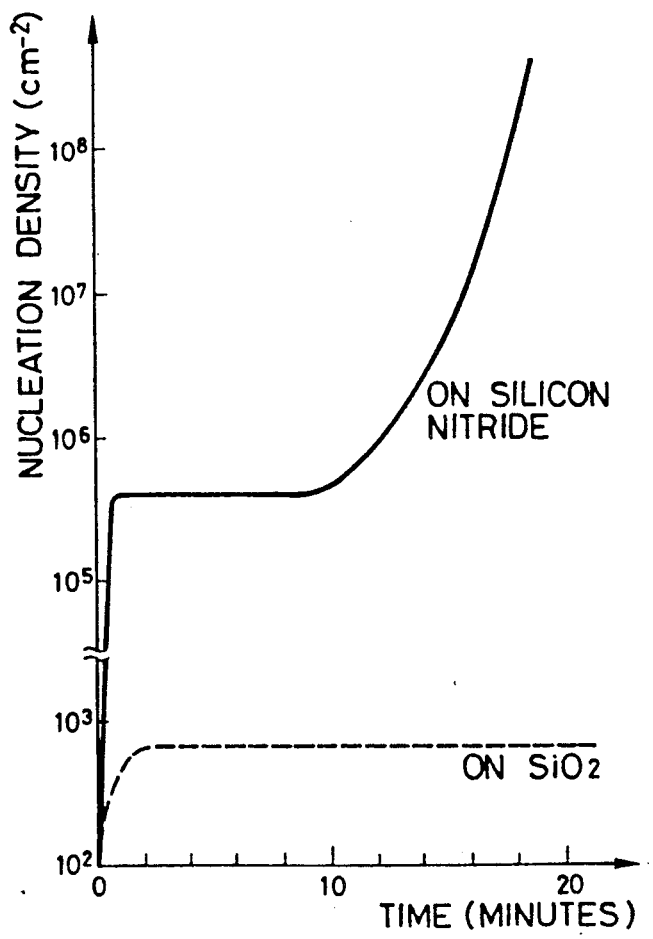
FIG. 3 is a graph showing the change with lapse of time of nucleation density (ND) on the deposition surface of $SiO_2$ and the deposition surface of silicon nitride.

FIG. 3 is a graph showing the change with lapse of time of nucleation density on the deposited surface of $SiO_2$ and the deposited surface of silicon nitride.

As shown in the same graph, soon after initiation deposition, the nucleation density on $SiO_2$ is saturated at $10^3$ cm$^{-2}$ or less, and the value is not substantially changed even after 20 minutes.

In contrast, on silicon nitride ($Si_3N_4$), it is once saturated at about $4 \times 10^5$ cm$^{-2}$ or less, is not substantially changed 10 minutes thereafter, but is abruptly increased thereafter. This measurement example shows the case in which $SiCl_4$ gas is diluted with $H_2$ and deposited according to the CVD method under the conditions of a pressure of 170 Torr and a temperature of 1000° C. Otherwise, the same action can be obtained by use of $SiH_4$, $SiH_2CL_2$, $SiHCl_3$, $SiF_4$, etc., as the reaction gas, and controlling the pressure, temperature, etc. Also, the vacuum vapor deposition can be employed.

In this case, nucleation on $SiO_2$ poses substantially no problem, but by addition of HCl gas into the reaction gas, nucleation on $SiO_2$ can be further suppressed to make deposition of Si on $SiO_2$ perfectly zero.

Such a phenomenon depends greatly on the difference in absorption coefficient, release coefficient, surface diffusion coefficient, etc., relative to Si of the material surfaces of $SiO_2$ and silicon nitride, but the fact that $SiO_2$ itself is etched by the reaction of $SiO_2$ with Si atom itself to form silicon monooxide with high vapor pressure, while no such etching phenomenon occurs on silicon nitride may be also considered to be a cause to effect selective deposition (T. Yonehara, S. Yoshioka, S. Miyazawa, Journal of Applied Physics 53, 6839, 1982).

Thus, by selecting $SiO_2$ and silicon nitride as the materials of the deposition surface and silicon as the material to be depostied, sufficiently great nucleation density difference as shown in the same graph can be obtained. Here, although $SiO_2$ is desirable as the material for the nonnucleation surface, this is not limitative and sufficiently practial nucleation density difference can be obtained even by use of $SiO_x$ ($0 < x < 2$).

Of course, the present invention is not limited to these materials, but the difference in nucleation density ($\Delta ND$) may be sufficiently $10^3$-fold or more in density of nuclei as shown by the same graph, and sufficient selective formation of deposited film can be done with the materials as examplified below.

As another method for obtaining this nucleation density difference ($\Delta ND$), ions of Al or Cu may be injected locally into the $SiO_2$ surface to form a region having excessive Al or Cu.

The present invention utilizes selective deposition based on such nucleation density difference ($\Delta ND$) and, by forming sufficiently finely so that a single nucleus may grow on the nucleation surface of a different kind of material having sufficiently greater nucleation density than the material of the nonnucleation surface, a single crystal of semiconductor can be grown selectively only at the site where such fine different kind of material exists.

In this connection, since selective growth of a single crystal of semiconductor is determined depending on the electron state of the depostion surface, particularly the state of dangling bonds, the material with lower nucleation density (for example, $SiO_2$) is not required to be a bulk material, but it may be formed only on the surface of any desired material, substrate, etc., to form the above deposited surface.

In the following, the present invention is described in detail by referring to the drawings.

Figure 4A:
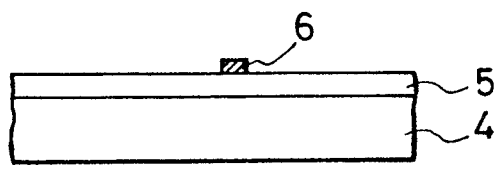
FIGS. 4A to 4D are illustrations of the formation steps showing a first embodiment of the method for forming semiconductor crystal according to the present invention.
Figure 4B:
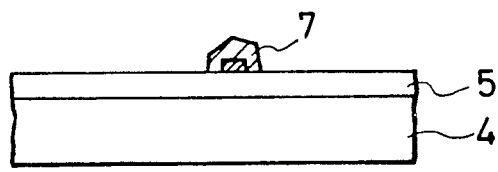
Figure 4C:
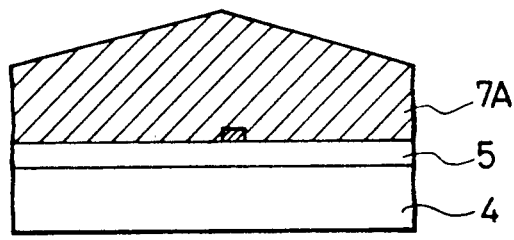
Figure 4D:
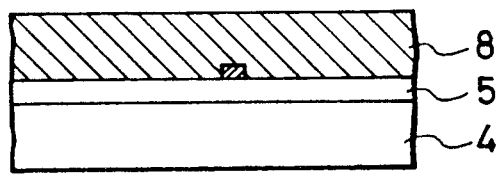
Figure 5A:
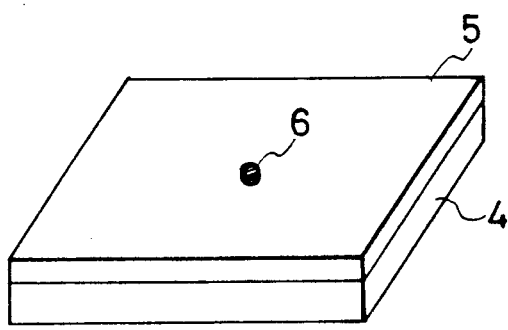
FIGS. 5A and 5B are perspective views of the substrate in FIGS. 4A and 4D.
Figure 5B:
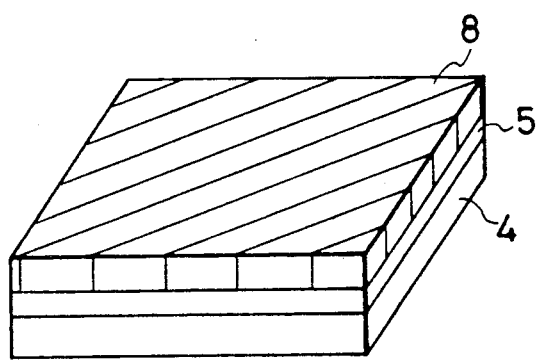
Figure 6A:
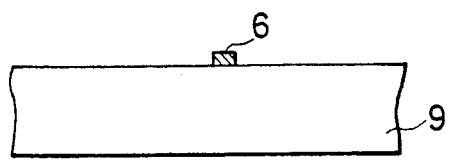
FIGS. 6A to 6D are illustrations of the steps for forming semiconductor crystal showing a second embodiment of the present invention.

FIGS 4A to 4D are illustrations of the formation steps showing a first embodiment of the method for forming semiconductor crystal according to the present invention, and FIGS. 5A and 5B are perspective views of the substrates in FIGS. 4A and 4D. First, as shown in FIG. 4A and FIG. 5A, on the support 4, a thin film [deposited surface ($S_{NDS}$)] with small nucleation density which enables selective deposition is formed and a metallic material different from the material forming the thin film 5 with greater nucleation density is deposited thinly, followed by patterning according to lithography, etc., to form sufficiently finely nucleation surface 6 ($S_{NDL}$)(or called "Seed") comprising a different kind of material. However, the size, the crystal structure and the composition of the support 4 may be any desired ones, and a support having a functional device formed thereon prepared according to conventional semiconductor technique may be employed. Also, the nucleation surface ($S_{NDL}$) 6 comprising a different kind of material is also inclusive of modified regions having excesive metals formed by metal ion injection into the thin film 5 as described above.

Next, by selection of appropriate deposition conditions, a single crystal of a thin film semiconductor material is formed only on the nucleation surface ($S_{NDL}$) 6. That is, the nucleation surface ($S_{NDL}$) 6 is required to be formed sufficiently finely so that only a single nucleus may be formed thereon. The size of the nucleation surface ($S_{NDL}$) 6, which may differ depending on the kind of the metallic material, may be several microns or less. Further, the nucleus grows while maintaining a single crystal structure to become a semiconductor single crystal grain 7 in shape of an island as shown in FIG. 4B. For forming an island-shaped single crystal grain 7, it is desirable to determine the conditions so that no nucleation may occur at all on the thin film 5, as already mentioned.

The island-shaped semiconductor single crystal grain 7 further grows while maintaining the single crystal structure with the nucleation surface ($S_{NDL}$) 6 as the center (lateral overgrowth), whreby it can cover over the whole thin film 5 as shown in FIG. 4C (single crystal 7A).

Subsequently, if necessary, the semiconductor single crystal 7A is flattened by etching or polishing, and a single crystal layer 8 capable of forming a desired device can be formed on the thin film 5 as shown in FIG. 4D and FIG. 5B.

For forming thus the thin film 5 forming the nonnucleation surface ($S_{NDS}$) on the support 4, any desired material can be used for the support 4 any desired material can be used for the support 4 which is the supporting member. Further, in such a case, even when the support 4 may be one having a functional device, etc., formed thereon according to conventional semiconductor technique, the single crystal layer 8 can be easily formed thereon.

In the above embodiment, the nonnucleation surface ($S_{NDS}$) is formed of thin film 5, but a support comprising a material with small nucleation density (ND) enabling selective nucleation may be used as such and nucleation surfaces ($S_{NDL}$) may be provided at any desired positions to form single crystal layers similarly thereon.

FIGS. 6A–6D are illustrations of the steps for forming semiconductor crystal showing a second embodiment of the present invention. As shown in these figures, on a support 9 comprising a material with small nucleation density (ND) enabling selective nucleation, the nucleation surface ($S_{NDL}$) comprising a metal with great nucleation density (ND) can be formed sufficiently finely to form a semiconductor single crystal 7A similarly as in the first embodiment.

Figure 7A:
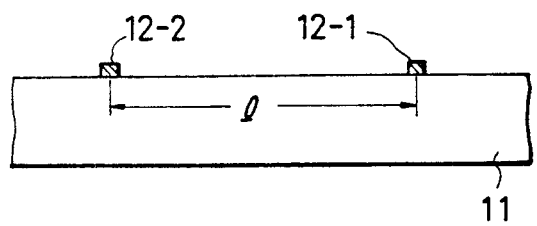
FIGS. 7A to 7D are illustrations of the formation steps showing a third embodiment of the method for forming semiconductor signal crystal according to the present invention.
Figure 6B:
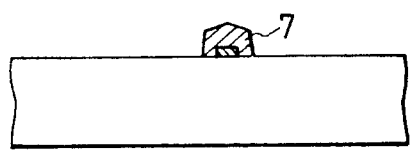
Figure 7B:
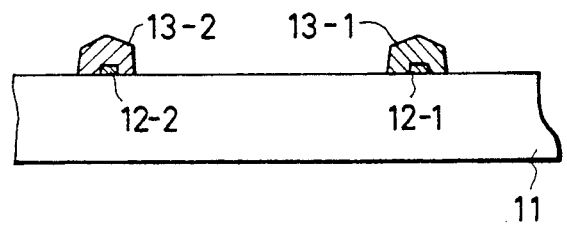
Figure 6C:
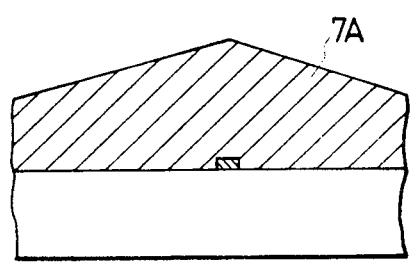
Figure 7C:
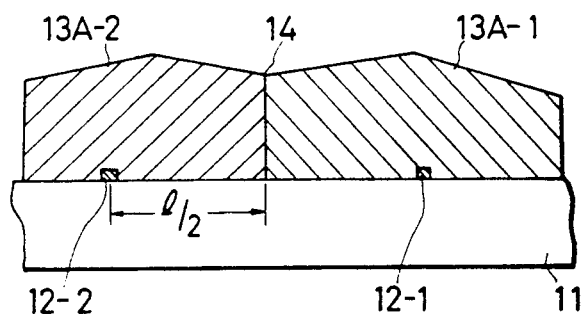
Figure 6D:
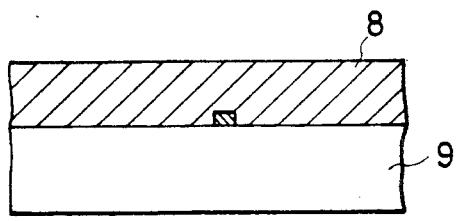
Figure 7D:
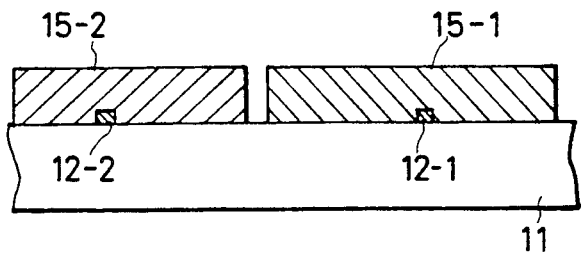
Figure 9A:
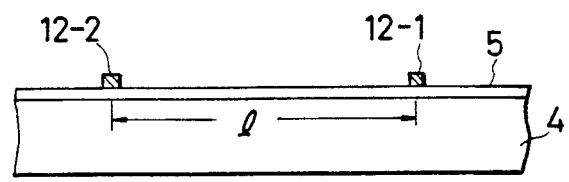
FIGS. 9A to 9D are illustrations of the steps for forming semiconductor crystal showing a fourth embodiment of the present invention.
Figure 8A:
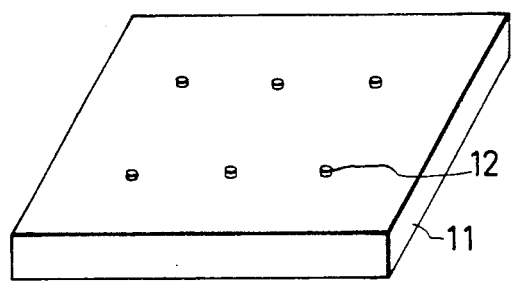
FIGS. 8A and 8B are perspective views of the substrates in FIGS. 7A and 7D.
Figure 9B:
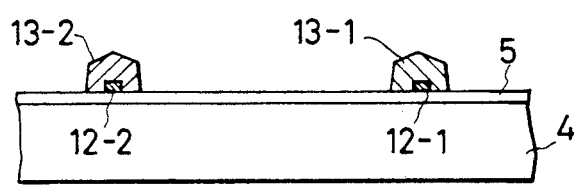
Figure 9C:
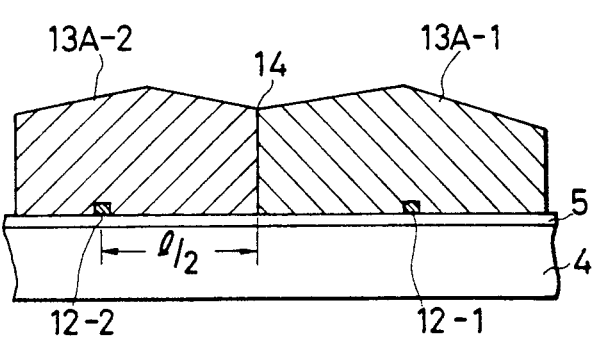
Figure 8B:
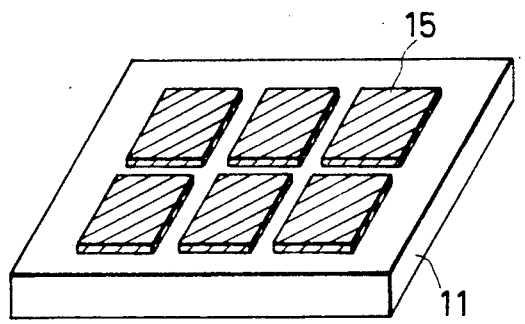
Figure 9D:
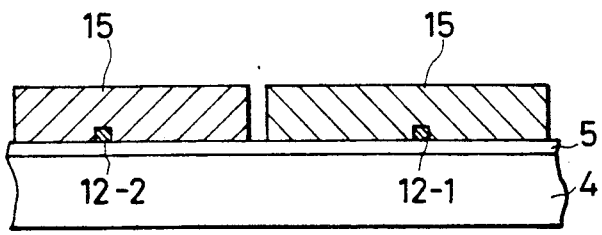

FIGS. 7A–7D are illustrations of the formation steps showing a third embodiment of the method for forming semiconductor crystal according to the present invention, and FIGS. 8A and 8B are perspective views of the substrates in FIGS. 7A and 7D.

As shown in FIG. 7A and FIG. 8A, on the amorphous insulating support 11, with an interval of a distance l, nucleation surfaces ($S_{NDL}$) 12-1, 12-2 of a metal dieffernent from the support 11 enabling the above selective nucleation are arranged sufficiently finely. The distance l is set equal to the size of the single crystal region required for formation of semiconductor device or group of devices or greater.

Next, by selecting appropriate crystal forming conditions, on the nucleation surfaces ($S_{NDL}$) 12-1, 12-2 only nucleus of a crystal forming semiconductor material is formed. That is the nucleation surfaces 12-1, 12-2 are required to be formed to a sufficiently fine size (area) to the extent that only a single nucleus may be formed. The size of the nucleation surfaces ($S_{NDL}$) 12-1, 12-2, which may be different depending on the kind of the material, may be several microns or less. Further, the nucleus grows while maintaining the single crystal structure, and become island-shaped semiconductor single crystal grains 13-1, 13-2 as shown in FIG. 7B. For forming island-shaped semiconductor single crystal grains 13-1, 13-2, it is desirable to determine the conditions so that no nucleation may occur at all on other surfaces than the nucleation surfaces ($S_{NDL}$) on the support 11.

The crystal direction in the normal line direction of the support 11 of the island-shaped semiconductor single crystal grains 13-1, 13-2 is determined so as to make the interface energy of the material of the support 11 and the material forming nucleus minimum. For instance or interface energy has anisotropy depending on the crystal face. However, as alreaddy mentioned, the crystal direction within the support plane in amorphous support is not determined.

The island-shaped semiconductor single crystal grains 13-1, 13-2 further grow to becomes semiconductor single crystals 13A-1, 13A-2 until the adjacent semiconductor single crystals 13A-1, 13A-2 contact each other as shown in FIG. 7C, but since the crystal direction within the support plane is not constant, a crystal grain boundary 14 is formed at the intermediate position between the nucleation surfaces ($S_{NDL}$) 12-1 and 12-2.

Subsequently, the semiconductor single crystals 13A-1, 13A-2 grow three-dimensionally, but crystal faces with slow growth speed appear as the fact. For this reason, the surfaces of semiconductor single crystals 13A-1, 13A-2 are flattened by etching or polishing, and further the portion of the grain boundary 14 is removed to form thin films of semiconductor single crystals 15-1, 15-2 containing no grain boundary in shape of lattices as shown in FIG. 7D and FIG. 8B. The size of the semiconductor single crystal films 15-1, 15-2, 15 is determined by the interval l, between the nucleation surfaces ($S_{NDL}$) as described above. That is, by determining appropriately the formation pattern of the nucleation surface ($S_{NDL}$) 12, the psotion of the grain boundary can be controlled to form semiconductor single crystals with desired sizes at a desired arrangement.

FIGS. 9A–9D are illustration of the steps for forming crystal showing a fourth embodiment of the present invention. As shown in these figures, similarly as in the first embodiment, a nonnucleation surface ($S_{NDS}$) 5 shaped in a thin film comprising a material with small nucleation density (ND) enabling selective nucleationis formed on a desired support 4, and a nucleation surfaces ($S_{NDL}$) 12 comprising a metal with greater nucleation density (ND) are formed at intervals of l, thereon, whereby semiconductor single crystal layers 15 can be formed similarly as in the above third embodiment.

Figure 10A:
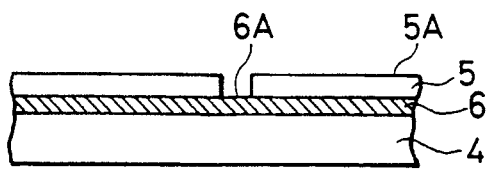
FIGS. 10A to 10D are illustrations of the formation steps showing a fifth embodiment of the method for forming semiconductor crystal according to the present invention.
Figure 10B:
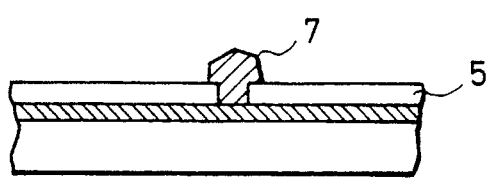
Figure 10C:
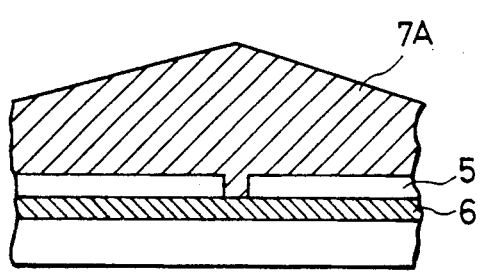
Figure 10D:
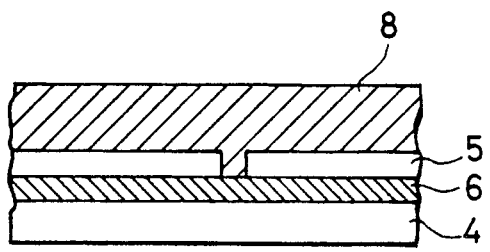
Figure 11A:
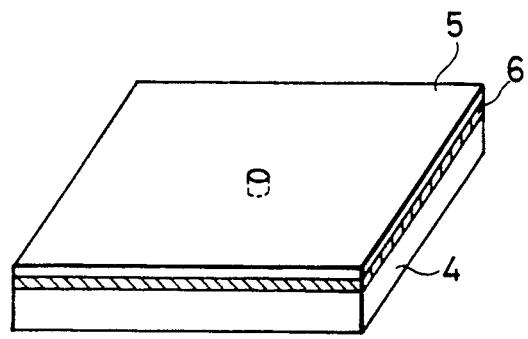
FIGS. 11A and 11B are perspective views of the substrate in FIGS. 10A and 10D.
Figure 11B:
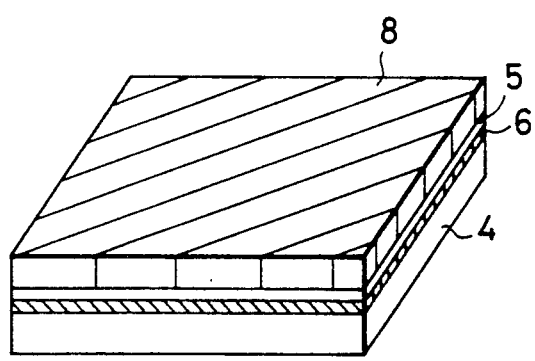
Figure 12A:
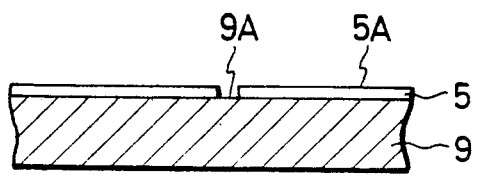
FIGS. 12A to 12D are illustrations of the steps for forming semiconductor crystal showing a sixth embodiment of the present invention.

FIGS. 10A–10D are illustrations of the formation steps showing a fifth embodiment of the method for forming semiconductor crystal according to the present invention, and FIGS. 11A and 11B are perspective views corresponding to FIGS. 4A and 4D.

First, as shown in FIG. 10A and FIG. 11A, on the support 4 is formed a metal thin film 6 with greater nucleation density enabling selective nucleation, on which a material different from the metal thin film 6 with greater nucleation density is thinly deposited, followed by patterning according to lithography, etc., to form a thin film 5 and forming nonnucleation surface ($S_{NDS}$) 5A so as to provide sufficiently finely nucleation surfaces ($S_{NDL}$) 6A. However, the size, the crystal structure and composition of the support 4 may be chosen as desired, and it may be also a support having a functional device prepared according to conventional semiconductor technique formed thereon. Also, the nucleation surface ($S_{NDL}$) 6A may be also formed as a modified region containing excessive metal element, which may be formed by forming a thin film 6 beneath the thin film 5 of a polycrystalline silicon or SiO$_2$, and injecting metal ions such as Al or Cu ions into the exposed portions of the thin film 6.

Next, by selection of appropriate deposition conditions, a single nucleus of crystal formation metallic material is formed only on the nucleation surface ($S_{NDL}$) 6A. That is, the nucleation surface ($S_{NDL}$) 6A is required to be formed sufficiently minutely so that only a single nucleus may be formed thereon. The size of the nucleation surface ($S_{NDL}$) 6A, which may be several microns or less. Further, the nucleus grows while maintaining a single crystal structure to become a semiconductor single crystal grain 7 in shape of an island as shown in FIG. 10B. For forming an island-shaped semiconductor single crystal grain 7, it is desirable to determine the conditions so that nonnucleation may occur at all on the thin film 5A, as already mentioned.

The island-shaped semiconductor single crystal grain 7 further grows while maintaining the single crystal structure with the nucleation surface ($S_{NDL}$) 6A as the center (lateral overgrowth), whereby it can cover over the whole sufract of the thin film 5 as shown in FIG. 10C (semiconductor single crystal 7A).

Subsequently, if necessary, the semiconductor single crystal 7A is flattened by etching or polishing, and a semiconductor single crystal layer 8 capable of forming a desired device can be formed on the thin film 5 as shown in FIG. 10D and FIG. 11B.

Thus, due to formation of the metal thin film 6 forming the nucleation surface ($S_{NDL}$) 6A on the support 4, any desired material can be used for the support 4 which is the supporting member. Further, in such a case, even when the suppport 4 may be one having a functional device, etc., formed thereon according to conventional semiconductor technique, the single crystal layer 8 can be easily formed thereon.

In the above embodiment, the nucleation surface ($S_{NDL}$) 6A is formed of metal thin film 6, but a support comprising a material with large nucleation density (ND) enabling selective nucleation may be used as such and nonnucleation surfaces ($S_{NDS}$) may be provided at any desired positions to form semiconductor single crystal layers similarly thereon as shown in FIG. 6.

FIGS. 12A–12D are illustrations of the steps for forming semiconductor crystal showing a sixth embodiment of the present invention. As shown in these figures, on a support 9 comprising a metal with large nucleation density (ND) enabling selective nucleation, the non-nucleation surface ($S_{NDS}$) 5A comprising a material with small nucleation density (ND) can be formed so as to give exposed portions of the support 9 as nucleation surface ($S_{NDL}$) 9A sufficiently minutely to form a semiconductor single crystal layer 8 similarly as in the first embodiment.

Figure 13A:
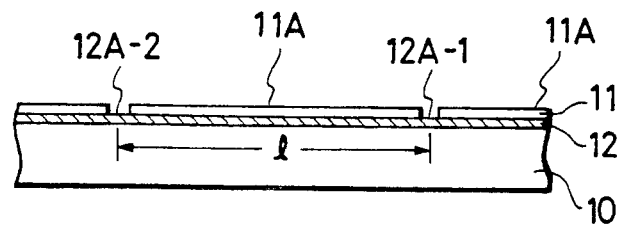
FIGS. 13A to 13D are illustrations of the formation steps showing a seventh embodiment of the method for forming semiconductor single crystal according to the present invention.
Figure 12B:
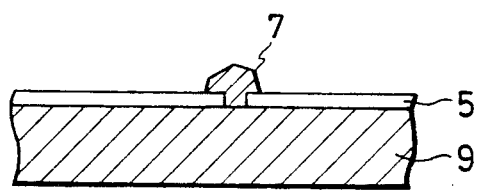
Figure 13B:
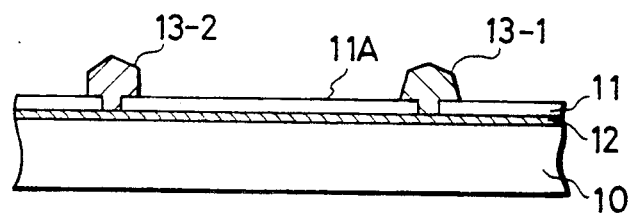
Figure 12C:
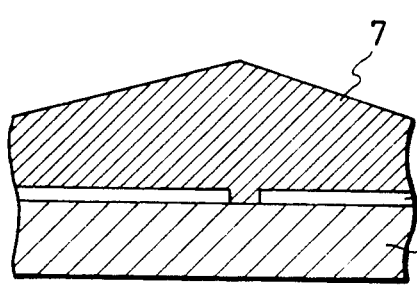
Figure 13C:
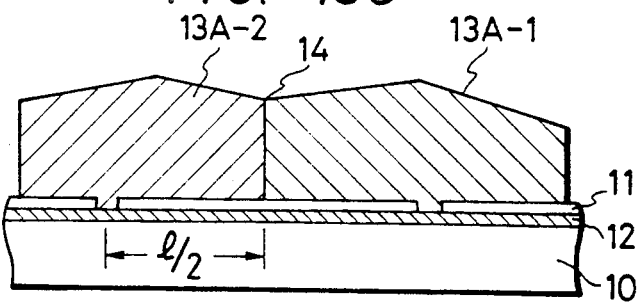
Figure 12D:
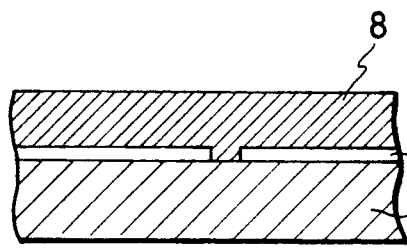
Figure 13D:
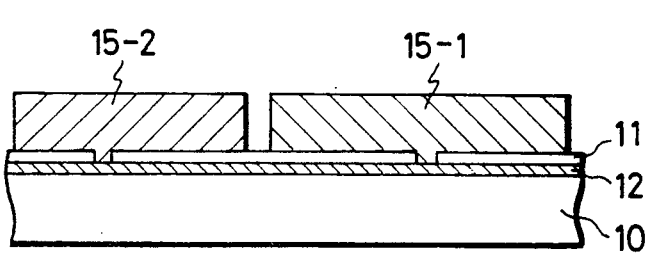
Figure 14A:
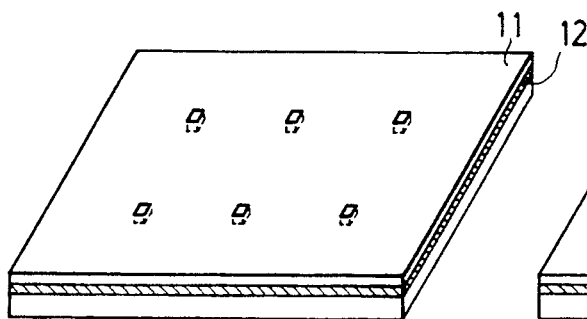
FIGS. 14A and 14B are perspective views of the substrates in FIGS. 13A and 13D.
Figure 14B:
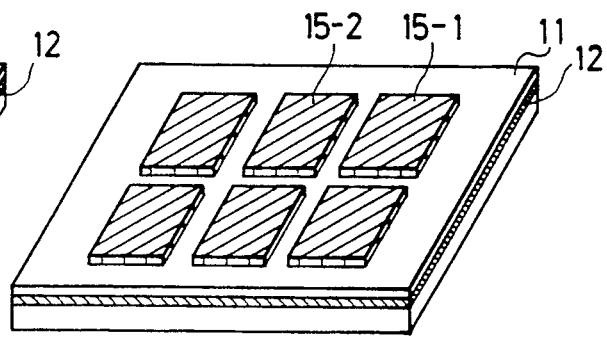

FIGS. 13A–13D are illustrations of the formation steps showing a seventh embodiment of the method for forming semiconductor crystal according to the present invention, and FIGS. 14A and 14B are perspective views corresponding to FIGS. 7A and 7D.

As shown in FIG. 13A and FIG. 14A, on an appropriate support 10 such as glass plate, etc., an amorphous metal thin film 12 with relatively greater nucleation density (ND) such s Al, Cu or AlCu alloy, etc., is provided, and on said metal thin film 12 is formed selectively a thin film 11 at a desired position with a different material having smaller nucleation density relative to the metal forming the thin film 12 which enables the above selective nucleation with an interval of a distance l, thereby arranging nucleation surfaces ($S_{NDL}$) 12A-1, 12A-2 with sufficiently small areas so as to form only single nucleus thereon. This distance l may be set at a size which is equal to or greater than the size of the single crystal region required for formation of a semiconductor device or a group of devices.

Next, by selecting appropriate crystal forming conditions, on the nucleation surface ($S_{NDL}$) 12-1, 12-2 only a nucleus of a crystal forming semiconductor material is formed. That is, as described above, the nucleation surfaces 12-1, 12-2 are required to be formed to a sufficiently fine size (area) to the extent that only a single nucleus may be formed. The size of the nucleation surfaces ($S_{NDL}$) 12-1, 12-2, which may be different depending on the kinds of the material, may be several microns or less. Further, the nucleus formed as above grows while maintaining the single crystal structure, and become island-shaped semiconductor single crystal grains 13-1, 13-2 as shown in FIG. 13B. For forming island-shaped semiconductor single crystal grains 13-1, 13-2, it is desirable to determine the conditions so that substantially nonnucleation may occur at all on other surfaces than the nucleation surfaces ($S_{NDL}$) 12A-1, 12A-2, [nonnucleation surface ($S_{NDS}$) 11A].

The crystal direction in the normal line direction of the metal thin film 12 of the island-shaped semiconductor single crystal grains 13-1, 13-2 is determined so as to make the interface energy of the metal of the film 12 and the material forming nucleus minimum. For surface or interface energy has anisotropy depending on the crystal face. However, as already mentioned, the crystal direction within the surface plane in amorphous surface is not determined.

The island-shaped semiconductor single crystal grains 13-1, 13-2 further grow to become semiconductor single crystals 13A-1, 13A-2 until the adjacent semiconductor single crystals 13A-1, 13A-2 contact each other as shown in FIG. 7C, but since the crystal directions within the support plane vary from one single crystal to another, a crystal grain boundary 14 is formed at the intermediate position between the nucleation surfaces ($S_{NDL}$) 12-1 and 12-2.

Subsequently, the semiconductor single crystals 13A-1, 13A-2 grow three-dimensionally, but crystal faces with slow growth speed appear as the facet. For this reason, the surfaces of semiconductor single crystals 13A-1, 13A-2 are flattened by etching or polishing, and further the portion of the grain boundary 14 is removed to form thin films of semiconductor single crystals 15-1, 15-2, . . . containing no grain boundary in shape of lattices as shown in FIG. 3D and FIG. 14B. The size of the semiconductor single crystal films 15-1, 15-2, . . . is determined by the interval l between the nucleation surfaces ($S_{NDL}$) 12A-1, 12A-2 as described above. That is, by determining appropriately the formation pattern of the nucleation surface ($S_{NDL}$) 12A-1, 12A-2, the position of the grain boundary can be controlled to form semiconductor single crystals with desired sizes at a desired arrangement.

In the following there will be explained application of the present invention to the manufacture of a photo-voltaic device.

EXAMPLE 1

Figure 15A:
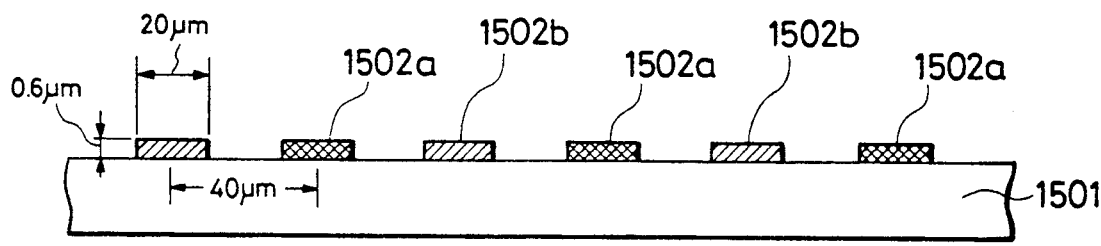
FIG. 15A to FIG. 19 are illustrations of the formation steps showing a first example.
Figure 15B:
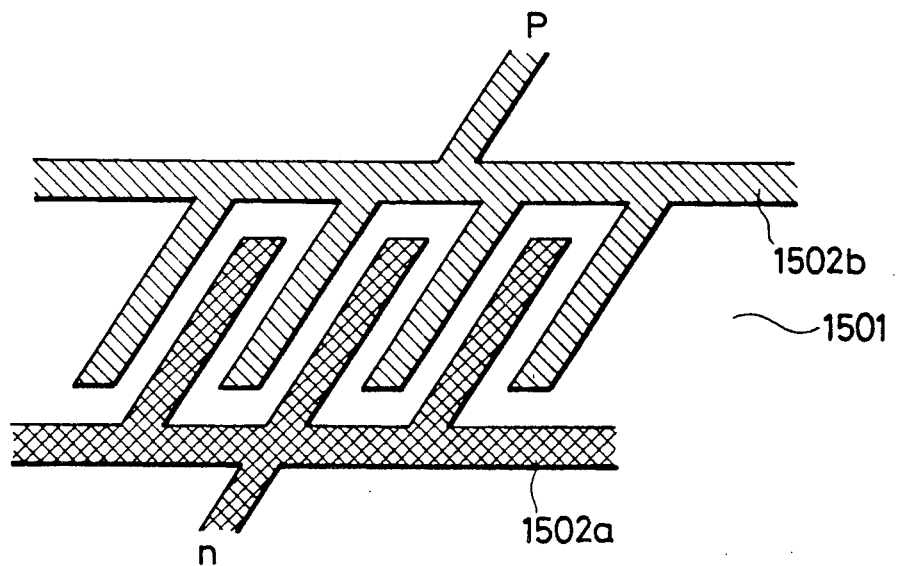

At first, as shown in FIGS. 15A and 15B, a metal such as Al or Cu is sputtered on a desired substrate 1501 such as a glass plate and is then patterned to form a first electrode 1502a for n-type semiconductor and a second electrode 1502b for p-type semiconductor of combtooth shape. FIG. 15A is a lateral cross-sectional view, and FIG. 15B is a perspective view. The substrate 1501 is composed of an insulating material, preferably of thermally resistant nature, such as ceramic glass. The electrodes 1502a and 1502b may be composed of same or different metals, and may be composed of Mo or W in addition to Al and Cu. In an example, the distance between the centers of said electrodes 1502a, 1502b is 40 μm, while the width of said electrodes is 20 μm, and the thickness thereof is 0.6 μm.

Figure 16:
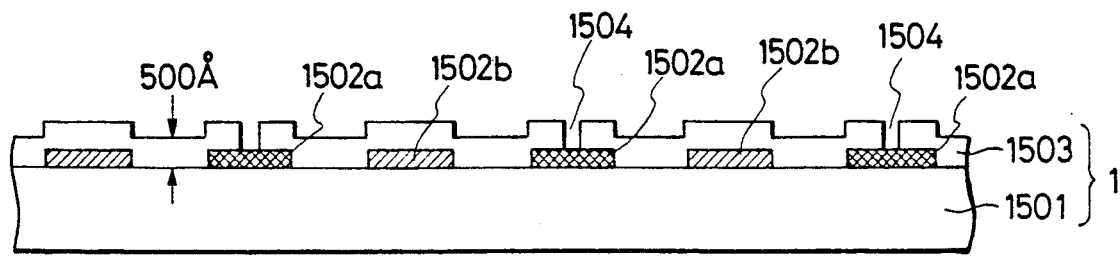

Then, as shown in FIG. 16, an insulating film 1503 composed for example of SiO$_2$ is deposited by CVD method in a thickness of 500 Å, and a contact hole 1504 is opened only in the electrode 1502a. The contact hole is opened, for example with a square form of 2 μm, by a reactive ion etching (RIE) equipment.

Figure 17:
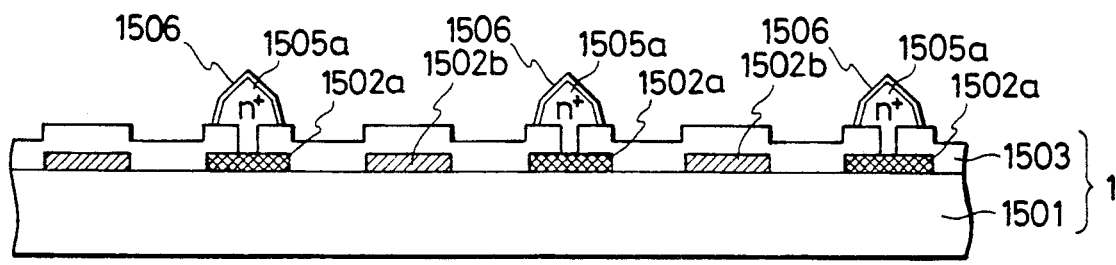

Then, as shown in FIG. 17, an n' silicon monocrystal, constituting a first semiconductor crystal, is grown on the electrode 1502b by the semiconductor crystal growing method of the present invention. The electrode 1502a is composed of a material of a large nucleation density such as Al, Cu, Mo or W, while the insulating film 1503 is composed of a material of a small nucleation density such as SiO$_2$. Said n-silicon monocrystal can be grown with mixed source gas composed of SiH$_2$Cl$_2$, HCl and H$_2$ with flow rates of 1.2:1.4:100 (l/min) and with PH$_3$ as dopant gas. An example of crystal growing conditions is a temperature of 900° C. and a pressure of 150 Torr.

The crystal growth is terminated when the silicon monocrystal 1505a grows to a certain size (being called island-shaped monocrystal). The surface of each island-shaped monocrystal 1505a is thermally oxidized to form a SiO$_2$ film 1506 on the surface. The size of the n-type silicon monocrystal can be arbitrarily selected according to the need, but is preferably selected in a range of 5 to 6 μm.

Figure 18:
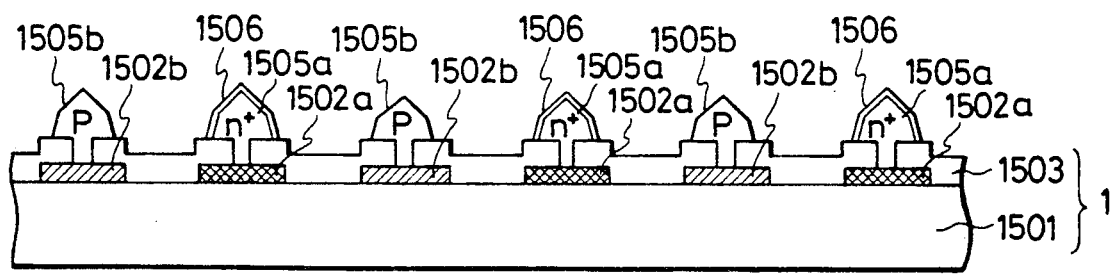

Then, as shown in FIG. 18, a contact hole for example of square form of 2 μm is opened in the insulating film 1503 on the electrode 1502b, in the same manner as in the case of the electrode 1502a. Then a p-silicon monocrystal 1505b constituting a second semiconductor crystal is grown under the same conditions as those for the n$_+$-silicon monocrystal 1505a, except that PH$_3$ is replaced by B$_2$H$_6$ as the dopant gas. Because of the presence of the SiO$_2$ film 1506 of small nucleation density on the surface of the n$^+$-type island-shaped silicon monocrystal 1505a, n-silicon monocrystal is not grown on said SiO$_2$ film 1506.

Figure 19:
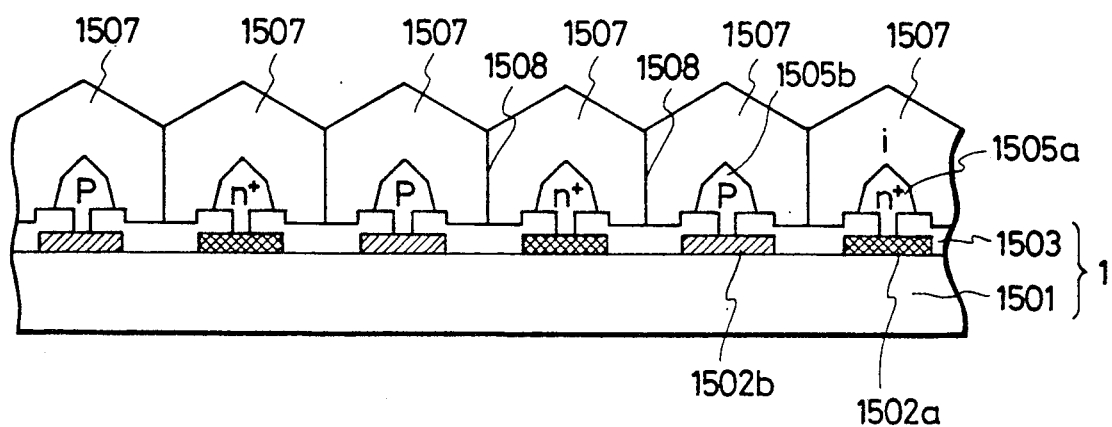

Then, as shown in FIG. 19, the SiO$_2$ film 1506 on the surface of the n$^+$-type island-shaped silicon monocrystal 1505a is removed by etching with HF solution, to expose the surface of the island-shaped silicon monocrystal 1505a. Subsequently an i-type silicon monocrystal 1507 is grown, utilizing said n$^+$-silicon monocrystal 1505a and p$^+$-silicon monocrystal 1505b as the seeds. Said i-silicon monocrystal 1507 can be grown, for example, with the conditions of SiH$_2$Cl$_2$:HCl:H$_2$ = 1.2:2.0:100, a growing temperature of 920° C. and a pressure of 150 Torr. The i-silicon monocrystals grow until they mutually collide, thus forming grain boundaries 1508. The grown crystals show characteristics facets as shown in FIG. 19. The photovoltaic device shows, under the irradiation of AMI light, for example, electric characteristics of an open-end voltage of 0.6V, a short-circuit current of 32 mA/cm$^2$, and a fill factor of 0.8.

The photovoltaic device shown in FIG. 19 has an extremely high efficiency of light introduction, since the aperture rate of the light-receiving face is 100%.

EXAMPLE 2

Figure 20:
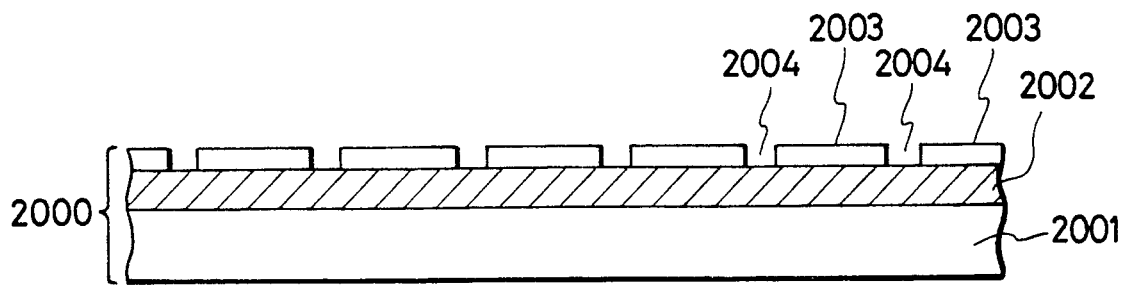
FIG. 20 to FIG. 22 are illustrations of the formation steps showing a second example.
Figure 21:
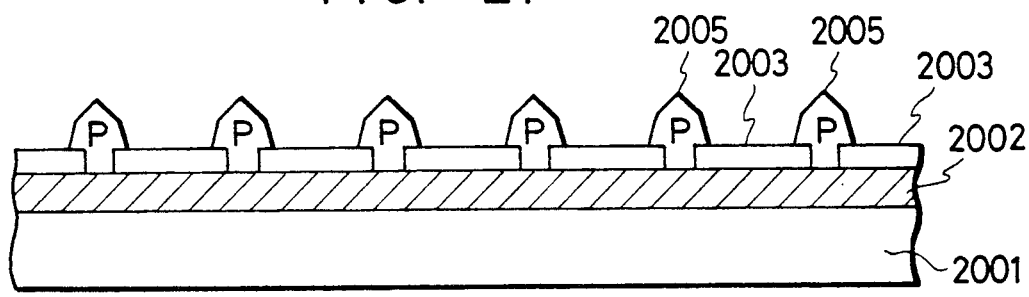
Figure 22:
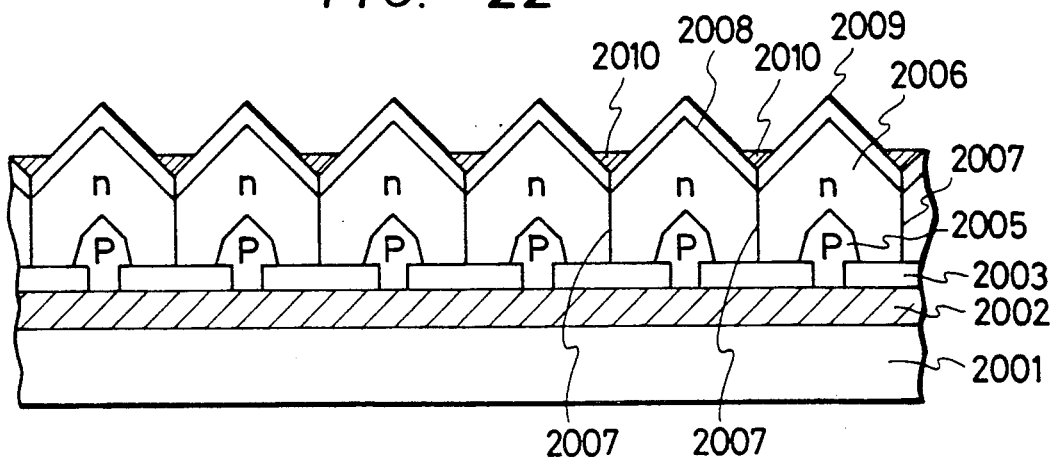

Now reference is made to FIGS. 20–22 for explaining the second embodiment of the present invention, at first, as shown in FIG. 20, molybdenum is deposited by sputtering in a thickness of ca. 1 μm over the entire surface for example of an alumina support 2001 to constitute a lower (second) electrode 2002. Then a SiO$_2$ film 2003 is deposited thereon by CVD with a thickness of 1000 Å, and contact holes 2004 of square form of 2 μm are formed in a two-dimensional matrix with a pitch of 50 μm, by means of a lithographic process and a RIE equipment. The substrate is not limited to alumina but can be composed of any thermally resistant material. Also the lower electrode is not limited to molybdenum but can be composed of any material with a low nucleation density for silicon such as tungsten.

In the structure shown in FIG. 20, the nucleation density of silicon is low on the SiO$_2$ film 2003, so that the silicon monocrystals are not grown on said film 2003. On the other hand, silicon monocrystals are grown on the Mo film which has a larger nucleation density than on the SiO$_2$ film. The difference in the nucleation density is in the order of 10$^3$ under the crystal growing conditions explained below. Then silicon is deposited on the substrate 2000 shown in FIG. 20 by thermal CVD under the following crystal growing conditions. Thus island-shaped silicon monocrystals 2005 (second semiconductor crystals) are grown from the silicon monocrystal seeds generated only on the Mo film 2001, and the growth is terminated when the grain size reaches 5–6 μm. In the following there is shown an example of crystal growing conditions.

gases: used:
   Si$_2$HCl$_2$ (source gas)
   BH$_3$ (dopant gas)
   HC$_1$ (etching gas)
   H$_2$ (carrier gas)
gas flow rate: Si$_2$HCl$_2$:HCl:H$_2$ = 1.2:1.6:100 (l/min)
substrate temperature: 900° C.

In this embodiment the silicon monocrystal 2005 is p-type due to the boron doping.

Then n-silicon monocrystals 2006 constituting first semiconductor crystals are grown thereon, utilizing PH$_3$ as dopant gas and following crystal growing conditions (FIG. 22). The neighboring n-silicon monocrystals 2006 become mutually contacted to form grain boundaries 2007, and develop facets 2008 thereon. On the n-silicon monocrystals 2006 there are grown, for ohmic contact with the electrode, an n$^+$-silicon monocrystals 2009 of a thickness of 1 μm under the following crystal growing conditions with an increased concentration of PH$_3$ gas. The crystal growing conditions are: gas flow rate Si$_2$HCl$_2$:HCl:H$_2$ = 1.2:1.6:100 (l/min); crystal growing temperature 920° C.; and pressure 150 Torr.

Finally aluminum comb-shaped electrode constituting the upper (first) electrode 2010 is formed on the grain boundaries 2007 of the silicon semiconductor monocrystals. A solar cell (photovoltaic device) thus formed shows an excellent energy conversion efficiency of ca. 16%. This value is significantly higher than that in the conventional amorphous silicon solar cells used as large-area low-cost solar cells.

Though the foregoing explanation has been limited to the use silicon monocrystals as the semiconductor crystals, the present invention is not limited to such case and there may be employed other semiconductor crystals such as GaAs or GaAsAl. It is also possible to obtain electronic devices such as a photovoltaic device or a photosensor, or optical semiconductor devices such as a light-emitting diode or a laser by arbitrarily controlling the conductive type of these semiconductor crystals into n-type or p-type.

We claim:

1. A semiconductor crystal article, comprising a substrate having (i) a deposition surface (S$_{NDS}$) with small nucleation density, (ii) a deposition surface (S$_{NDL}$) formed of a metal arranged adjacent to said deposition surface (S$_{NDS}$) having a sufficiently small area so as to form only a single nucleus and greater nucleation density (ND$_1$) than the nucleation density (ND$_S$) of said deposition surface (S$_{NDS}$), and (iii) a semiconductor silicon monocrystal grown from said single nucleus which covers said deposition surface (S$_{NDL}$).

2. A semiconductor crystal article according to claim 1, wherein said deposition surface (S$_{NDL}$) is arranged in a plural number.

3. A semiconductor crystal article according to claim 1, wherein said deposition surface ($S_{NDL}$) is arranged as sectionalized in a plural number.

4. A semiconductor crystal article according to claim 1, wherein said deposition surface ($S_{NDL}$) is arranged in a plural number as sectionalized regularly within said deposition surface ($S_{NDS}$).

5. A semiconductor crystal article according to claim 1, wherein said deposition surface ($S_{NDL}$) is arranged in a plural number as sectionalized irregularly within said deposition surface ($S_{NDS}$).

6. A semiconductor crystal article according to claim 2, wherein the semiconductor single crystals grown from the respective deposition surfaces ($S_{NDL}$) contact with the single crystals grown from the adjacent deposition surfaces ($S_{NDL}$).

7. A semiconductor crystal article according to claim 2, wherein the semiconductor single crystals grown from the respective deposition surface ($S_{NDL}$) are spatially apart from the single crystals grown from the adjacent deposition surface ($S_{NDL}$).

8. A crystal article, comprising a semiconductor crystal forming surface formed of an amorphous material, a nucleation surface ($S_{NDL}$) formed of a metal with sufficiently greater nucleation density (ND) than said amorphous material forming said crystal surface, having a sufficiently small area so as to form only a single nucleus on said crystal forming surface, and a semiconductor silicon monocrystal grown from said single nucleus on said nucleation surface ($S_{NDL}$).

9. A crystal article according to claim 8, wherein said nucleation surface ($S_{NDL}$) is provided in a plural number with desired intervals, and having grain boundaries approximately at the center between said nucleation surfaces ($S_{NDL}$).

10. A semiconductor crystal article, comprising a substrate for formation of semiconductor silicon monocrystal having a nonnucleation surface ($S_{NDS}$) formed of an amorphous material and a nucleation surface ($S_{NDL}$) formed of a metal different from said amorphous material having greater nucleation density (ND) than said nonnucleation surface ($S_{NDS}$) relative to the material for forming the semiconductor silicon monocrystal to be formed, and semiconductor silicon monocrystal formed corresponding one by one to said nucleation surface ($S_{NDL}$) on said nucleation surfaces.

11. A semiconductor crystal article according to claim 10, wherein said amorphous material is $SiO_2$.

12. An electronic device produced by utilizing a semiconductor crystal article of claim 1.

13. An electronic device produced by utilizing a semiconductor crystal article of claim 8.

14. An electronic device produced by utilizing a semiconductor crystal article of claim 10.

15. The semiconductor crystal article according to claim 1, wherein said deposition surface ($S_{NDL}$) is formed of silicon oxide.

16. The semiconductor crystal article according to claim 1, wherein said metal is at least one selected from the group consisting of Al, Cu, W and Mo.

17. The semiconductor crystal article according to claim 1, wherein, said semiconductor single crystal is constituted of silicon.

18. The crystal article according to claim 8, wherein said amorphous material is silicon oxide.

19. The crystal article according to claim 8, wherein said metal forming said nucleation surface ($S_{NDL}$) is at least one selected from the group consisting of Al, Cu, W and Mo.

20. The semiconductor crystal article of claim 10, wherein said metal forming said nucleation surface ($S_{NDL}$) is at least one selected from the group consisting of Al, Cu, W and Mo.

21. A semiconductor crystal article comprising a substrate having a surface constituted of an amorphous material and a nucleation surface constituted of a metal, and a semiconductor single crystal grown from said nucleation surface, wherein said nucleation surface has a greater nucleation density than said amorphous material and a sufficiently small area so as to form only a single nucleus from which a silicon monocrystal is grown.

22. The semiconductor crystal article according to claim 21, wherein said amorphous material is silicon dioxide.

23. The semiconductor crystal article according to claim 21, wherein said metal is at least one selected from the group consisting of Al, Cu, W and Mo.

24. A photovoltaic device comprising a substrate having an (i) electrode constituted of a metal, and (ii) a film formed of an insulating material having a contact hole exposing said electrode, wherein said metal has a greater nucleation density than said insulating material, and an area of said electrode exposed through said contact hole is sufficiently small so as to form only a single nucleus from which a silicon moncrystal is grown, and (iii) a photoelectric conversion region formed from a semiconductor silicon monocrystal which is grown from said single nucleus.

25. A crystal article produced by the process which comprises applying a semiconductor crystal forming treatment on a substrate having a free surface comprising a nonnucleation surface ($S_{NDS}$) with small nucleation density and a nucleation surface ($S_{NDL}$) with metal exposed from said nonnucleation surface having a sufficiently small area for a crystal growing only from a single nucleus and having a greater nucleation density ($ND_l$) then the nucleation density ($ND_s$) of said nonnucleation surface ($S_{NDS}$), thereby growing a semiconductor silicon crystal from said single nucleus.

26. A crystal article produced by the process which comprises applying a semiconductor crystal forming treatment on a substrate having two kinds of crystal formation surfaces with a sufficiently great nucleation density difference ($\Delta ND$), of which the nucleation surfaces ($S_{NDL}$) of metal with greater nucleation density is exposed from the nonnucleation surface ($S_{NDS}$) with smaller nucleation density and has a sufficiently small area for a semiconductor silicon crystal growing from only a single nucleus to form a stable single nucleus on said nucleation surface ($S_{NDL}$), thereby growing a semiconductor silicon monocrystal from said single nucleus.

27. A crystal article produced by the process which comprises forming a nucleation surface ($S_{NDL}$) at a desired site of a base substrate surface with large nucleation density exposed as a small area for a crystal growing from only a single nucleus by providing onto said base substrate surface a nonnucleation surface ($S_{NDS}$) having smaller nucleation density ($ND_S$) than nucleation density ($ND_L$) of said nucleation surface ($S_{NDL}$) by addition of a metal ($M_S$) for forming said nonnucleation sursface ($S_{NDS}$) which is different from the material ($M_L$) forming said nucleation surface ($S_{NDL}$) to obtain a substrate, and then applying a semiconductor crystal forming treatment on said substrate to form a single nucleus on said nucleation surface ($S_{NDL}$), thereby growing a silicon monocrystal from said single nucleus.

28. A crystal article produced by the process which comprises utilizing the differences in nucleation density between the crystal forming materials depending on the kinds of the materials for forming the crystal forming surface, which comprises forming selectively on a base substrate a thin film of a material ($M_S$) with smaller nucleation density than the metal ($M_L$) of the surface of base substrate so as to leave an uncovered area on the surface of base substrate to thereby form a nucleation surface ($S_{NDL}$) having a sufficiently small area so that only a single nucleus may grow forming only a single nucleus on said nucleation surface ($S_{NDL}$) and growing a semiconductor silicon monocrystal from said single nucleus, thereby forming a semiconductor crystal.

29. A crystal article produced by the process which comprises forming selectively a semiconductor single crystal layer by utilizing the difference in nucleation density between the semiconductor crystal forming materials depending on the kinds of the materials for forming crystal forming surfaces, which comprises forming selectively on a base substrate having a surface of metal with sufficiently large nucleation density of an amorphous material a thin film of a material with smaller nucleation density than said amorphous material so as to leave an exposed area of the surface of said base substrate to provide a nucleation surface having a sufficiently small area to form only a single nucleus, and with a distance of the required size of said single crystal layer or more, then forming only a single nucleus on said nucleation surface ($S_{NDL}$) to grow a semiconductor silicon monocrystal from said single nucleus, thereby forming selectively a semiconductor single crystal layer.

30. The photovoltaic device according to claim 24, wherein said electrode constituted of a metal is selected from the group consisting of Al, Cu, W and Mo.

31. The photovoltaic device according to claim 24, wherein said insulating material is silicon dioxide.

32. The photovoltaic device according to claim 24, wherein said photoelectric conversion region is constituted of a p-n junction.

33. The photovoltaic device according to claim 24, wherein said photoelectric conversion region is constituted of a p-i-n- junction.

* * * * *

UNITED STATES PATENT AND TRADEMARK OFFICE
CERTIFICATE OF CORRECTION

PATENT NO. : 5,130,103

DATED : July 14, 1992

INVENTOR(S) : KENJI YAMAGATA ET AL.    Page 1 of 3

It is certified that error appears in the above-identified patent and that said Letters Patent is hereby corrected as shown below:

On the title page:

AT [56] REFERENCES CITED

Foreign Patent Documents,
"59-69495  8/1984  Japan" should read
--59-69495  4/1984  Japan--.

COLUMN 3

Line 44, "culty" should read --cultly--.
Line 52, "difficulty" should read --difficultly--.

COLUMN 5

Line 66, "amterial" should read --material--.

COLUMN 6

Line 52, "difficulty" should read --difficultly--.

COLUMN 8

Line 34, "excesive" should read --excessive--.
Line 54, "wherby" should read --whereby--.
Line 64, "any desired mate-" should be deleted.
Line 65, "rial can be used for the support 4" should be deleted.

COLUMN 9

Line 26, "diefferent" should read --different--.
Line 51, "in-" should be deleted.
Line 52, "stance" should read --surface--.
Line 53, "alreaddy" should read --already--.

UNITED STATES PATENT AND TRADEMARK OFFICE
CERTIFICATE OF CORRECTION

PATENT NO. : 5,130,103

DATED : July 14, 1992

INVENTOR(S) : KENJI YAMAGATA ET AL.

It is certified that error appears in the above-identified patent and that said Letters Patent is hereby corrected as shown below:

COLUMN 10

Line 9, "psotion" should read --position--.
    Line 17, "nucleationis" should read --nucleation is--.
    Line 18, "a" should be deleted.
    Line 53, "6A, which may" should read --6A may--.

COLUMN 11

Line 27, "minutely" should read --minute--.
    Line 39, "s" should read --as--.

COLUMN 15

Line 63, "wherein," should read --wherein--.

UNITED STATES PATENT AND TRADEMARK OFFICE
CERTIFICATE OF CORRECTION

PATENT NO.  : 5,130,103
DATED       : July 14, 1992
INVENTOR(S) : KENJI YAMAGATA ET AL.

It is certified that error appears in the above-identified patent and that said Letters Patent is hereby corrected as shown below:

COLUMN 16

Line 41, "$(ND_1)$" should read --$(ND_L)$--.
Line 43, "silicon crystal" should read --silicon monocrystal--.
LIne 49, "is" should read --are--.
Line 51, "has" should read --have--.
Line 52, "silicon crystal" should read --silicon monocrystal--.

Signed and Sealed this

Thirtieth Day of November, 1993

Attest:

BRUCE LEHMAN

*Attesting Officer*   *Commissioner of Patents and Trademarks*